(12) United States Patent
Ogawa et al.

(10) Patent No.: US 7,767,485 B2
(45) Date of Patent: Aug. 3, 2010

(54) SOLID-STATE IMAGING DEVICE AND METHOD FOR MANUFACTURING SAME

(75) Inventors: Masaaki Ogawa, Kanagawa-ken (JP); Hitoshi Sugiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/511,402

(22) Filed: Jul. 29, 2009

(65) Prior Publication Data
US 2010/0025791 A1 Feb. 4, 2010

(30) Foreign Application Priority Data
Aug. 1, 2008 (JP) ............................. 2008-199287

(51) Int. Cl.
*H01L 21/00* (2006.01)
(52) U.S. Cl. ..................... 438/65; 438/57; 438/64; 438/68; 257/E21.536; 257/E31.127
(58) Field of Classification Search ............... 438/64, 438/65, 66, 67, 68; 257/E21.536, E31.127
See application file for complete search history.

(56) References Cited

U.S. PATENT DOCUMENTS

| 6,168,965 | B1 | 1/2001 | Malinovich et al. |
| 6,285,064 | B1 | 9/2001 | Foster |
| 2006/0094151 | A1* | 5/2006 | Sumi ........................ 438/57 |
| 2008/0185603 | A1* | 8/2008 | Itoi et al. ........................ 257/98 |
| 2008/0303107 | A1* | 12/2008 | Minamio et al. ............. 257/432 |
| 2009/0032893 | A1* | 2/2009 | Weng et al. .................. 257/432 |
| 2009/0224345 | A1* | 9/2009 | Lee et al. ..................... 257/432 |

FOREIGN PATENT DOCUMENTS

| JP | 5-41506 | 2/1993 |
| JP | 2003-273343 | 9/2003 |
| JP | 2007-88118 | 4/2007 |
| JP | 2007-123909 | 5/2007 |

* cited by examiner

*Primary Examiner*—Charles D Garber
*Assistant Examiner*—Angel Roman
(74) *Attorney, Agent, or Firm*—Oblon, Spivak, McClelland, Maier & Neustadt, L.L.P.

(57) ABSTRACT

An interconnect layer is formed on a lower face of a silicon wafer, a support substrate is adhered over a lower face of the interconnect layer, and a thickness reduction of the silicon wafer is performed from an upper face side. Next, a photodiode is formed in an upper face of the silicon wafer, and a microlens is formed at a position corresponding to the photodiode. An adhesive layer is formed on the silicon wafer in a region not covering the microlens, a low refractive index layer having a lower refractive index than the microlens is formed in a region covering the microlens, and a glass substrate is adhered to the silicon wafer by the adhesive layer. The support substrate is removed from the interconnect layer, and a solder ball is bonded to a lower face of the interconnect layer. Thereafter, a CMOS image sensor is manufactured by dicing the silicon wafer.

16 Claims, 5 Drawing Sheets

SOLID-STATE IMAGING DEVICE AND METHOD FOR MANUFACTURING SAME

CROSS-REFERENCE TO RELATED APPLICATIONS

This application is based upon and claims the benefit of priority from the prior Japanese Patent Application No. 2008-199287, filed on Aug. 1, 2008; the entire contents of which are incorporated herein by reference.

BACKGROUND OF THE INVENTION

1. Field of the Invention

This invention relates to a backside illuminated solid-state imaging device and a method for manufacturing the same.

2. Background Art

In recent years, the power consumption and size of solid-state imaging devices are being reduced in response to the popularity of digital still cameras and mobile telephones including cameras. CMOS (Complementary Metal Oxide Semiconductor) image sensors are being used in addition to conventional CCD (Charge-Coupled Device) image sensors. Such an image sensor is formed on one semiconductor chip and includes a sensor unit (imaging pixel unit), in which a plurality of pixels are two-dimensionally arranged, and a peripheral circuit unit disposed outside of the sensor unit.

In a conventional CMOS image sensor, a photodiode (PD) is formed in the surface of the silicon substrate for each pixel. An interconnect layer for transmitting electrical signals is provided on the silicon substrate. A color filter layer also is provided on the interconnect layer for each photodiode. A microlens is provided thereupon such that light efficiently reaches the photodiode. A glass substrate is disposed thereabove via a cavity.

In such a CMOS image sensor, light entering from the exterior passes through the glass substrate and the cavity, enters each microlens, is concentrated by the microlens, passes through the color filter layer and the interconnect layer, and then is incident on the photodiode. The light incident on the photodiode undergoes photoelectric conversion; a signal charge is produced; and an electrical signal is generated from the signal charge. Thereby, image data is acquired.

However, in such a CMOS image sensor, it is necessary that the light concentrated by the microlens passes through the interconnect layer including metal interconnect before reaching the photodiode. Although the metal interconnect is disposed in the interconnect layer to avoid regions between the microlenses and the photodiodes, the amount of light reflected/absorbed by the metal interconnect increases as pixel pitches are reduced due to downsizing of the image sensor and increasing pixel count. By this amount of reflected/absorbed light, the light incident on the photodiode decreases, and the light reception sensitivity decreases. The light reflected by the metal interconnect may become incident on a photodiode of an adjacent pixel to cause color mixture.

To solve such problems, a backside illuminated CMOS image sensor has been proposed (for example, refer to JP-A 2003-273343 (Kokai)). In a backside illuminated image sensor, a photodiode is formed in one face of a thin semiconductor substrate, and a color filter layer and a microlens are disposed on the one face. A glass substrate is disposed above the microlens via an adhesive layer and a cavity partitioned by the adhesive layer. On the other hand, transistors and the like forming a peripheral circuit are formed in another face of the semiconductor substrate. An interconnect layer is provided on the other face. A thick support substrate is affixed to the interconnect layer, and solder balls are mounted on the surface of the support substrate. Vias passing through the support substrate connect the solder balls to the metal interconnect in the interconnect layer.

In such a backside illuminated image sensor, optical components such as the photodiodes, the color filter layers, the microlenses, and the glass substrate are disposed on the side of one face of the semiconductor substrate; and electrical components such as the transistors forming the peripheral circuit, the interconnect layer, the vias, and the solder balls are disposed on the side of the other face of the semiconductor substrate. Therefore, the interconnect layer is not disposed in the optical path from the glass substrate through the cavity, the microlens, and the color filter layer to the photodiode. Therefore, light is not reflected/absorbed by the metal interconnect. As a result, light reception sensitivity is high, and color mixture does not occur readily.

However, it is necessary to provide a thick support substrate to ensure strength for such a backside illuminated image sensor. Therefore, the camera module height is undesirably increased by the amount of the support substrate and cannot easily be made thinner. Moreover, a process to make vias in the thick support substrate is necessary. Therefore, manufacturing costs undesirably increase.

SUMMARY OF THE INVENTION

According to an aspect of the invention, there is provided a solid-state imaging device, including: a semiconductor substrate including a photodiode formed in an upper face; a microlens provided on the semiconductor substrate at a position corresponding to the photodiode; an adhesive layer provided on the semiconductor substrate not to cover the microlens; a low refractive index layer provided on the semiconductor substrate to cover the microlens, the low refractive index layer formed from a low-refractive-index material having a refractive index lower than a refractive index of a material forming the microlens; a transparent substrate covering the adhesive layer and the low refractive index layer, the transparent substrate adhered to the semiconductor substrate by the adhesive layer; an interconnect layer provided on a lower face of the semiconductor substrate; and an external connection member bonded to a lower face of the interconnect layer.

According to another aspect of the invention, there is provided a method for manufacturing a solid-state imaging device, including: forming an interconnect layer on a lower face of a semiconductor substrate; adhering a support substrate over a lower face of the interconnect layer; performing a thickness reduction of the semiconductor substrate from an upper face side; forming a photodiode in an upper face of the semiconductor substrate; forming a microlens on the semiconductor substrate at a position corresponding to the photodiode; forming an adhesive layer on the semiconductor substrate in a region not covering the microlens and forming a low refractive index layer on the semiconductor substrate in a region covering the microlens, the low refractive index layer made of a low-refractive-index material having a refractive index lower than a refractive index of a material forming the microlens; adhering a transparent substrate to the semiconductor substrate by the adhesive layer to cover the adhesive layer and the low refractive index layer; removing the support substrate; and bonding an external connection member to a lower face of the interconnect layer.

According to still another aspect of the invention, there is provided a method for manufacturing a solid-state imaging device, including: forming an interconnect layer on a lower face of a semiconductor wafer; adhering a support substrate over a lower face of the interconnect layer; performing a thickness reduction of the semiconductor wafer from an upper face side; forming a photodiode in an upper face of the semiconductor wafer; forming a microlens on the semiconductor wafer at a position corresponding to the photodiode; forming an adhesive layer on the semiconductor wafer in a region not covering the microlens and forming a low refractive index layer on the semiconductor wafer in a region covering the microlens, the low refractive index layer made of a low-refractive-index material having a refractive index lower than a refractive index of a material forming the microlens; adhering a transparent substrate to the semiconductor wafer by the adhesive layer to cover the adhesive layer and the low refractive index layer; removing the support substrate; bonding an external connection member to a lower face of the interconnect layer; and dicing the semiconductor wafer into a plurality of semiconductor substrates

DETAILED DESCRIPTION OF THE INVENTION

An embodiment of the invention will now be described with reference to the drawings.

Figure 1:
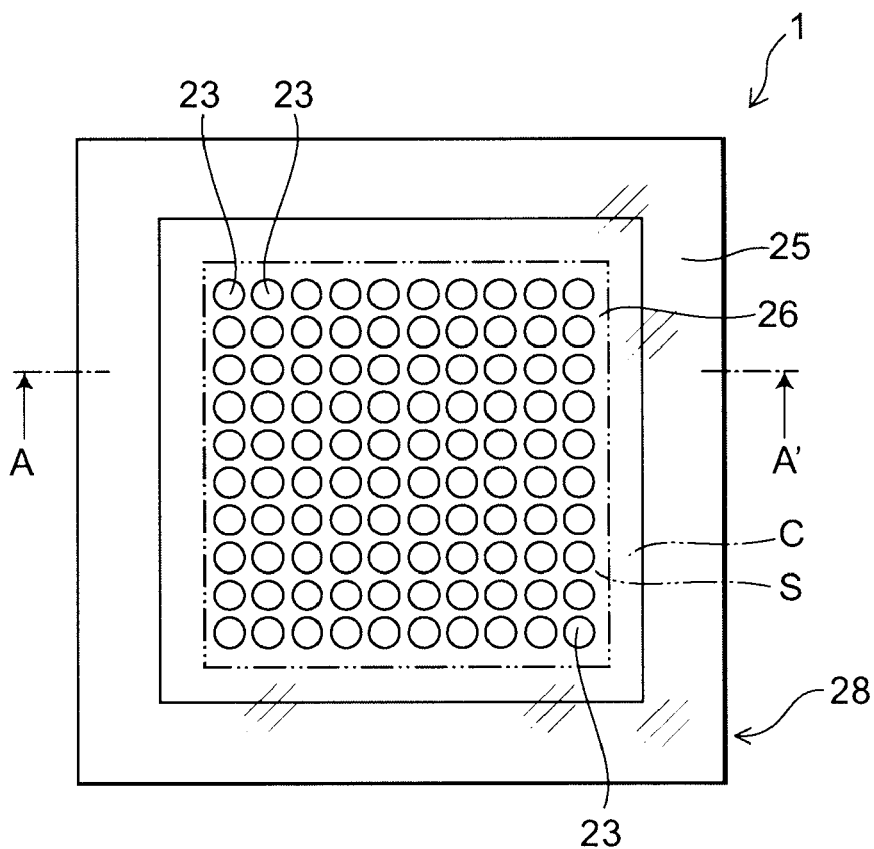
FIG. 1 is a plan view illustrating a solid-state imaging device according to an embodiment of the invention.

FIG. 1 is a plan view illustrating a solid-state imaging device according to this embodiment.

Figure 2:
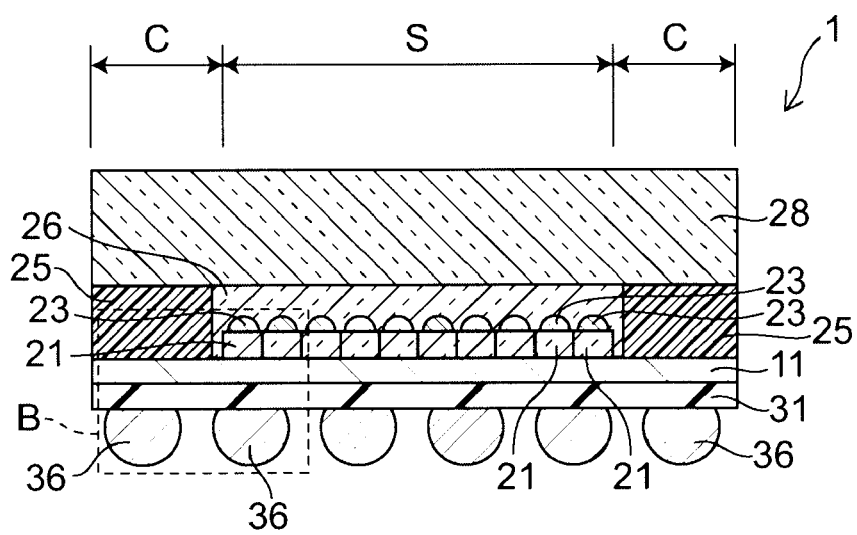
FIG. 2 is a cross-sectional view along line A-A' of FIG. 1.

FIG. 2 is a cross-sectional view along line A-A' of FIG. 1.

Figure 3:
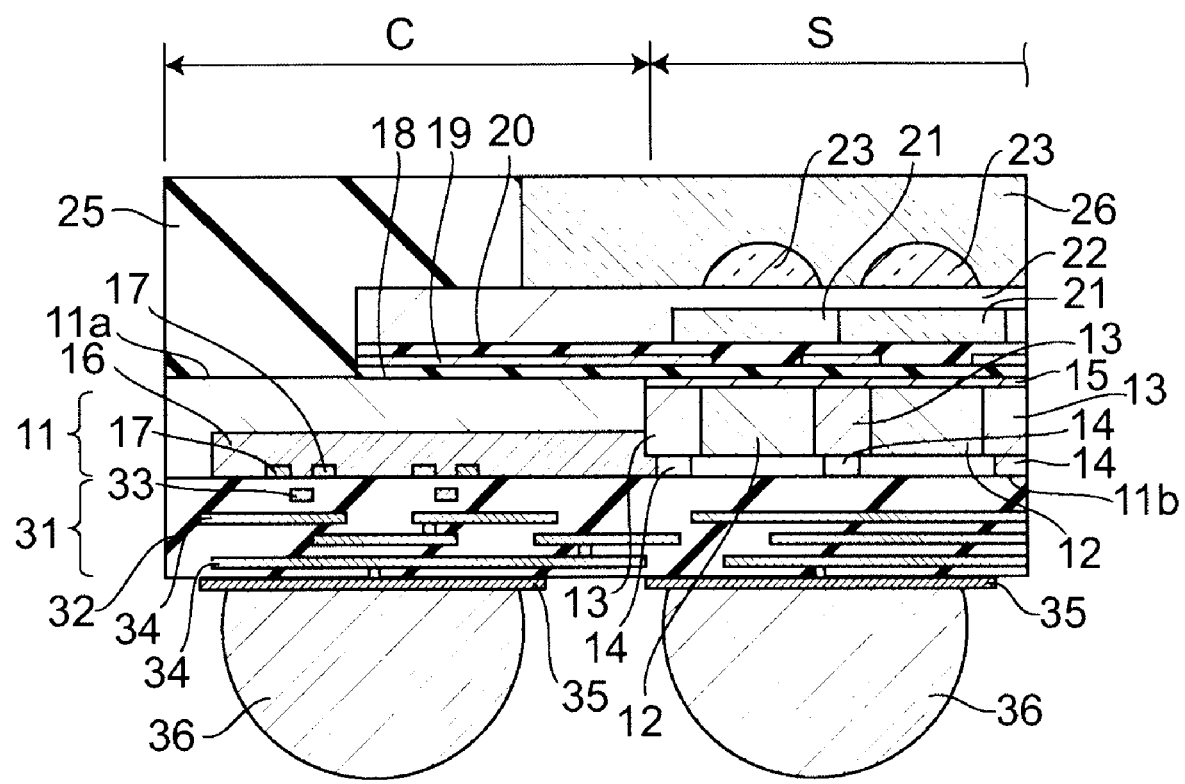
FIG. 3 is a partially enlarged cross-sectional view of portion B of FIG. 2.

FIG. 3 is a partially enlarged cross-sectional view of portion B of FIG. 2.

For better clarity of the drawings, the aspect ratio, the dimensional ratio of components, and the number of components in the drawings are different than actual values thereof. For example, although FIG. 1 illustrates only about ten rows and ten columns of microlenses, more microlenses having a smaller size are actually formed.

The solid-state imaging device according to this embodiment is, for example, a backside illuminated CMOS image sensor.

A silicon substrate 11 made of, for example, single crystal silicon having a p-type conductivity is provided in a CMOS image sensor 1 (also referred to hereinbelow as simply "sensor") according to this embodiment illustrated in FIG. 1 and FIG. 2. The thickness of the silicon substrate 11 is not greater than ten microns. The silicon substrate 11 has a rectangular configuration as viewed from a direction perpendicular to a major surface of the silicon substrate 11. A sensor unit S is formed from a rectangular region in a central portion of the silicon substrate 11. A peripheral circuit unit C is formed from a region having a frame-like configuration surrounding the sensor unit S. The sensor unit S is a portion which receives light and converts the light into an electrical signal. A signal processing circuit is provided in the peripheral circuit unit C to process the electrical signal output by the sensor unit S. A drive circuit also is provided in the peripheral circuit unit C to drive the sensor unit S. The signal processing circuit includes, for example, a CDS (correlated double sampling) circuit, an A/D conversion circuit, and the like. The drive circuit includes, for example, vertical and horizontal scanners, a timing generator, and the like.

In the sensor unit S illustrated in FIG. 3, a plurality of photodiodes 12 are made of an n-type diffusion region in one major surface (hereinbelow referred to as "upper face") 11a of the silicon substrate 11. The photodiodes 12 are arranged in, for example, a matrix configuration. Element separation regions 13 are made of $p^+$-type diffusion regions in regions of the silicon substrate 11 between the photodiodes 12. Floating diffusion regions 14 made of n-type diffusion regions are formed below the element separation regions 13. A $p^+$-type surface diffusion layer 15 is formed in an uppermost face of the silicon substrate 11 over the entire region directly above the photodiodes 12 and the element separation regions 13.

On the other hand, in the peripheral circuit unit C, a p-type well 16 is formed in another major surface (hereinbelow referred to as "lower face") 11b of the silicon substrate 11. An n-type source/drain region 17 is formed in a portion of the lower face of the well 16. The source/drain region 17 forms a transistor of the peripheral circuit unit C.

An insulating film 18 made of, for example, silicon oxide is provided on the upper face side of (hereinbelow referred to as "above") the silicon substrate 11 to cover at least the sensor unit S. A light-shielding metal film 19 made of, for example, aluminum is provided in a portion of region on the insulating film 18. The light-shielding metal film 19 is provided on the insulating film 18 in a region excluding portions corresponding to the photodiodes 12. A passivation film 20 made of, for example, silicon nitride is provided to cover the light-shielding metal film 19.

Color filter layers 21 are provided in portions of regions on the passivation film 20. The color filter layer 21 is provided for each photodiode 12. The color filter layers 21 are, for example, red, green, and blue transparent films. A planarizing film 22 is provided on the entire surface to cover the color filter layers 21.

Microlenses 23 are provided on the planarizing film 22. Each microlens 23 is a plano-convex lens formed from a transparent material, e.g., acrylic resin, having a refractive index of not less than 1.5, e.g., 1.5 to 1.6. Each microlens 23 is provided at a position corresponding to each color filter layer 21, and accordingly, at a position corresponding to each photodiode 12. In other words, each microlens 23 is disposed at a position such that light entering the microlens 23 passes through the respective color filter layer 21 and is incident on the respective photodiode 12. The insulating film 18, the light-shielding metal film 19, the passivation film 20, and the planarizing film 22 are omitted in FIG. 2.

An adhesive layer 25 and a low refractive index layer 26 are provided on the silicon substrate 11 at substantially the same height. That is, an upper face of the adhesive layer 25 and an upper face of the low refractive index layer 26 form substantially the same plane. There is a region in at least a portion of the peripheral circuit unit C in which the insulating film 18, the light-shielding metal film 19, the passivation film 20, the color filter layer 21, and the planarizing film 22 are not formed. The upper face 11a of the silicon substrate 11 is exposed in this region and contacts the adhesive layer 25.

As illustrated in FIG. 1, the adhesive layer 25 is provided not to cover the microlenses 23, and the low refractive index layer 26 is provided to cover the microlenses 23. More specifically, the adhesive layer 25 is provided in a frame-like configuration in an outer circumferential side portion of a region directly above the peripheral circuit unit C of the silicon substrate 11. The low refractive index layer 26 is filled into a space surrounded by the adhesive layer 25 and provided in a substantially rectangular parallelepiped configuration in a region directly above the sensor unit S and in a region directly above an inner circumferential side portion of the peripheral circuit unit C of the silicon substrate 11 to contact the microlenses 23.

The adhesive layer 25 is formed from an adhesive which is adherent to glass. The low refractive index layer 26 is formed from a transparent low-refractive-index material having a refractive index lower than that of the material forming the microlens 23. It is favorable that the refractive index of the low-refractive-index material forming the low refractive index layer 26 is not greater than 1.4, and more favorably not greater than 1.3. Materials having a refractive index not greater than 1.3 and sufficient light transmission include, for example, $SiO_2$ fluoride polymer, silicone resin, polysiloxane resin, epoxy resin containing hollow silica, etc.

A transparent glass substrate 28 is provided above the adhesive layer 25 and the low refractive index layer 26 to cover the adhesive layer 25 and the low refractive index layer 26. The glass substrate 28 is provided in the entire region directly above the silicon substrate 11. A lower face of the glass substrate 28 contacts the upper face of the adhesive layer 25 and the upper face of the low refractive index layer 26. The glass substrate 28 is adhered to the silicon substrate 11 by the adhesive layer 25. Therefore, a cavity does not exist between the silicon substrate 11 and the glass substrate 28.

On the other hand, an interconnect layer 31 is provided on a lower face side of (hereinbelow referred to as "below") the silicon substrate 11. The interconnect layer 31 is provided in the entire region directly below the silicon substrate 11. An upper face of the interconnect layer 31 contacts the lower face of the silicon substrate 11. Gate electrodes 33 made of, for example, polysilicon and multiple layers of metal interconnect 34 made of, for example, aluminum are buried in an inter-layer dielectric film 32 made of, for example, silicon oxide in the interconnect layer 31. The gate electrodes 33 form transistors with the source/drain regions 17 formed in the silicon substrate 11. These transistors function as transistors forming the peripheral circuit unit C, transfer transistors which move charge stored in the photodiodes 12 into the floating diffusion regions 14, and amplifier transistors which detect and amplify electrical potential fluctuations of the floating diffusion regions 14.

Electrode pads 35 are provided on the lower face of the interconnect layer 31. Solder balls 36 are bonded to the electrode pads 35 as external connection members. A plurality of solder balls 36 are provided, for example, on the entire region of the lower face of the interconnect layer 31 and are bonded to each of the electrode pads 35.

The following dimensions are examples of sizes of the portions described above. The profile of the sensor 1 as viewed from above is a square having five-millimeter sides. Accordingly, the profiles of the interconnect layer 31, the silicon substrate 11, the adhesive layer 25, and the glass substrate 28 also are squares having five-millimeter sides as viewed from above. The thickness of the interconnect layer 31 is one to three microns. The thickness of the silicon substrate 11 is three to five microns. The thickness of the adhesive layer 25 and the low refractive index layer 26 is 10 to 100 microns. The thickness of the glass substrate 28 is 300 to 500 microns.

The CMOS image sensor 1 according to this embodiment is mounted inside, for example, a mobile telephone. In such a case, the sensor 1 is mounted on a motherboard of the mobile telephone via the solder balls 36. An optical lens is disposed above the sensor 1, that is, on the glass substrate 28 side. Light entering the mobile telephone from the exterior via the optical lens passes through the glass substrate 28 and the low refractive index layer 26 to reach each of the microlenses 23. An image is optically formed on the arrangement surface of the microlenses 23. At this time, the refractive index of the low refractive index layer 26 is lower than the refractive index of the microlens 23. For example, the refractive index of the low refractive index layer 26 is not greater than 1.4, and the refractive index of the microlens 23 is 1.5 to 1.6. Therefore, light incident on the microlens 23 is refracted by the interface between the low refractive index layer 26 and the microlens 23 and is concentrated by the microlens 23. Then, wavelengths of the light are selected when the light passes through the color filter layer 21, regions of the light are selected by the light-shielding metal film 19, and the resulting light is incident on the photodiode 12.

In the photodiode 12, the incident light undergoes a photoelectric conversion, and a signal charge is produced. The signal charge is transferred to the floating diffusion region 14 by a transfer transistor (not illustrated) to cause the potential of the floating diffusion region 14 to fluctuate. An amplifier transistor (not illustrated) detects and amplifies the potential fluctuation, generates an electrical signal, and outputs the result to the peripheral circuit unit C. The peripheral circuit unit C processes the electrical signal, generates a signal having a prescribed form, and outputs the signal to the exterior of the sensor 1 via the solder balls 36. On the other hand, the peripheral circuit unit C drives the transfer transistor and the amplifier transistor provided in the sensor unit S.

A method for manufacturing the solid-state imaging device according to this embodiment will now be described.

FIGS. 4A to 4D, FIGS. 5A to 5C, and FIGS. 6A to 6B are process cross-sectional views of illustrating the method for manufacturing the solid-state imaging device according to this embodiment.

In this embodiment, the sensor 1 is manufactured using CSCM (Chip Scale Camera Module) technology.

Figure 4A:
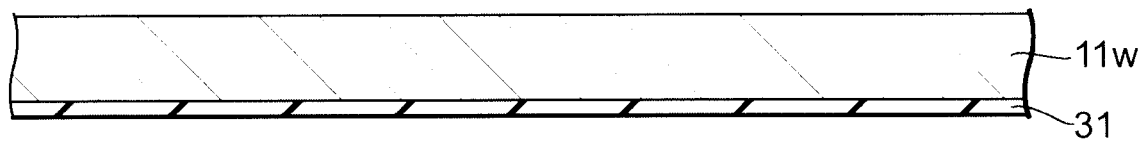
FIGS. 4A to 4D are process cross-sectional views illustrating a method for manufacturing the solid-state imaging device according to this embodiment of the invention.

First, as illustrated in FIG. 4A, a silicon wafer 11w made of, for example, single crystal silicon having the p-type conductivity is prepared. The thickness of the silicon wafer 11w is, for example, not less than 100 microns, e.g., 100 to 500 microns. The silicon wafer 11w undergoes a thickness reduction and dicing in subsequent steps to form the silicon substrates 11 (referring to FIG. 2) described above. In other words, the silicon wafer 11w includes a plurality of silicon substrates 11.

Then, various impurity diffusion regions illustrated in FIG. 3, namely, the p-type well 16, the n-type source/drain region 17, and the n-type floating diffusion region 14, are formed in one major surface (lower face) 11b of the silicon wafer 11w. The interconnect layer 31 is then formed on the lower face 11b of the silicon wafer 11w. The gate electrode 33 and the metal interconnect 34 are formed in the inter-layer dielectric film 32 in the interconnect layer 31. Thereby, a drive circuit and a signal processing circuit are formed on the silicon wafer 11w in a region where the peripheral circuit unit C of the sensor 1 will be formed in a subsequent step, and a transfer transistor and an amplifier transistor are formed in a region where the sensor unit S will be formed in a subsequent step.

Figure 4B:
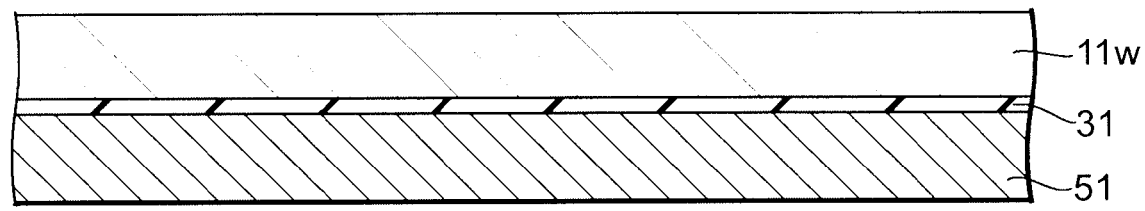

Continuing as illustrated in FIG. 4B, a support substrate 51 is adhered to the lower face of the interconnect layer 31. A silicon substrate having a thickness of, for example, 100 to 500 microns may be used as the support substrate 51.

Figure 4C:
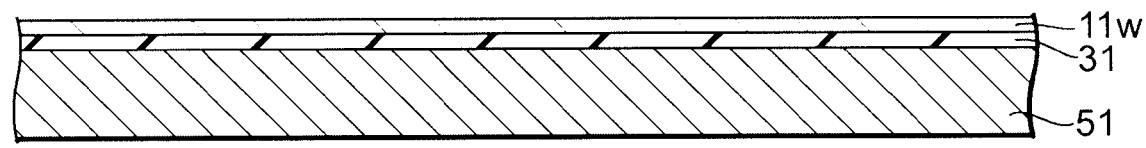

Then, as illustrated in FIG. 4C, the silicon wafer 11w is ground from the other major surface (upper face) 11a side by BSG (Back Side Grinding). The silicon wafer 11w undergoes a thickness reduction to reach a thickness of not greater than ten microns, e.g., not greater than five microns.

Continuing, the photodiode 12 made of an n-type diffusion region, the element separation region 13 made of a $p^+$-type diffusion region, and the surface diffusion layer 15 made of a $p^+$-type diffusion region illustrated in FIG. 3 are formed in the upper face 11a of the silicon wafer 11w in each region where the sensor unit S of each sensor 1 will be formed in a subsequent step.

Figure 4D:
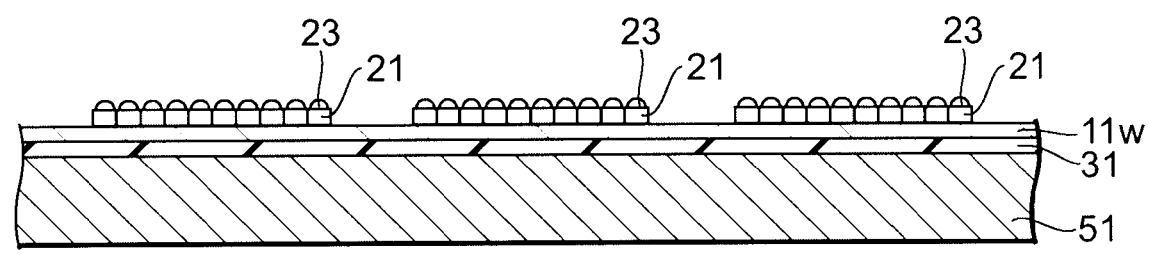

Then, as illustrated in FIG. 3 and FIG. 4D, the insulating film 18 made of, for example, silicon oxide, the light-shielding metal film 19 made of, for example, aluminum, and the passivation film 20 made of, for example, silicon nitride are formed on the upper face 11a. The color filter layer 21 is formed on the passivation film 20 for each of the photodiodes 12. The planarizing film 22 is formed to cover the color filter layers 21. At this time, in a portion of the region where the peripheral circuit unit C will be formed in a subsequent step, the insulating film 18, the light-shielding metal film 19, the passivation film 20, the color filter layer 21, and the planarizing film 20 are not formed and thus leave the silicon wafer 11w exposed.

The plano-convex microlens 23 is formed on the planarizing film 22 for each of the color filter layers 21. The microlens 23 is formed on the silicon wafer 11w at a position corresponding to the photodiode 12. The microlens 23 is formed from a transparent material, e.g., acrylic resin, having a refractive index of not less than 1.5, e.g., 1.5 to 1.6.

Figure 5A:
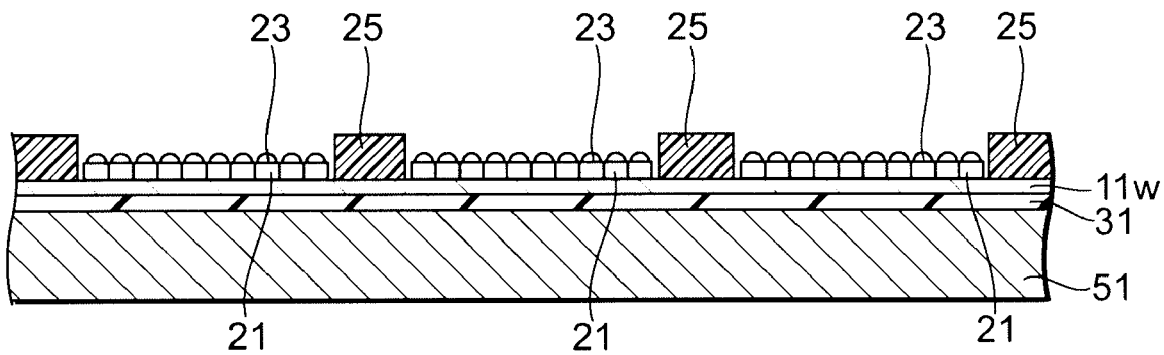
FIGS. 5A to 5C are process cross-sectional views illustrating the method for manufacturing the solid-state imaging device according to this embodiment of the invention.

The adhesive layer 25 is then formed on the silicon wafer 11w as illustrated in FIG. 5A. The adhesive layer 25 is patterned in a lattice configuration as viewed from above and disposed in a region directly above a region of the peripheral circuit unit C which does not contact the sensor unit S. At this time, the adhesive layer 25 is not provided in a region directly above the sensor unit S, and is thus formed in a region which does not cover the microlenses 23. The adhesive layer 25 adheres to the silicon wafer 11w in the exposed region described above.

Figure 5B:
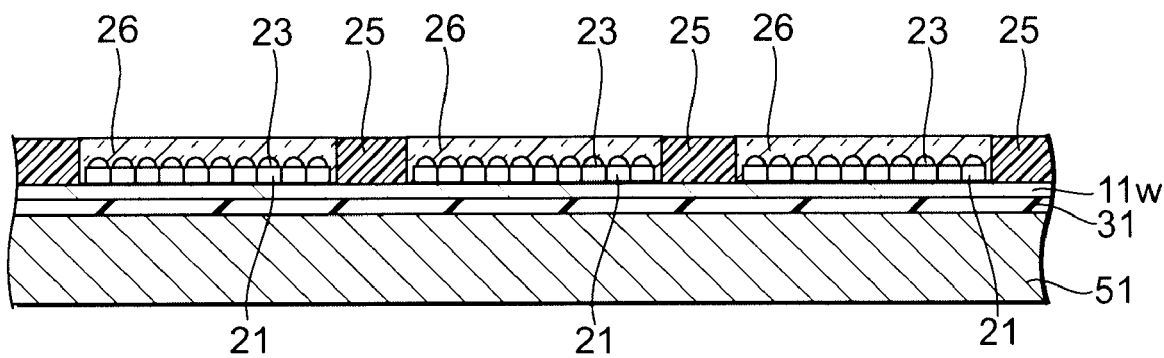

Then, as illustrated in FIG. 5B, low-refractive-index materials are poured into the spaces partitioned by the lattice configuration of the adhesive layer 25 to form the low refractive index layers 26 in a region directly above both the entire sensor unit S and a region of the peripheral circuit unit C contacting the sensor unit S. Thereby, the low refractive index layers 26 are formed on the silicon wafer 11w to contact the microlenses 23 in a region which covers the microlenses 23. As described above, the low-refractive-index material is a transparent material having a refractive index lower than that of the material forming the microlens 23. It is favorable that the refractive index of the low-refractive-index material is not greater than 1.4, and more favorably, not greater than 1.3. The upper face of the low refractive index layer 26 and the upper face of the adhesive layer 25 have substantially the same height.

Figure 5C:
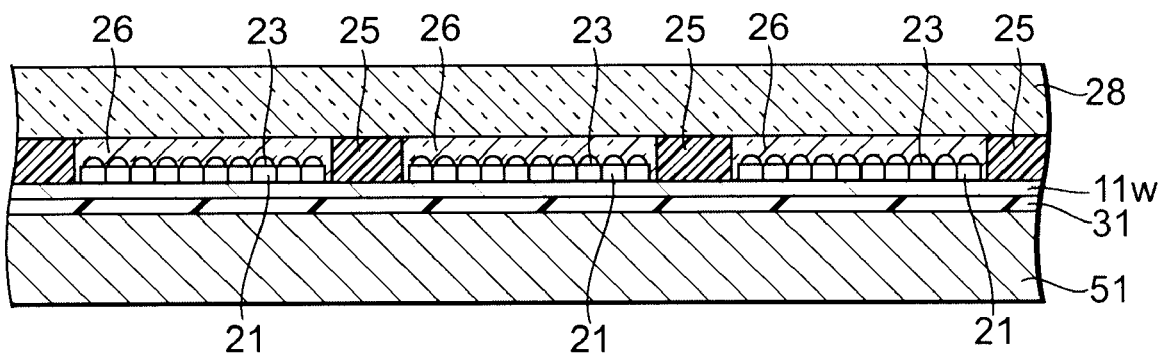

Continuing as illustrated in FIG. 5C, the glass substrate 28 is disposed above the adhesive layer 25 and the low refractive index layers 26 to contact the upper faces of the adhesive layer 25 and the low refractive index layers 26. Thereby, the glass substrate 28 is adhered to the silicon wafer 11w by the adhesive layer 25.

Figure 6A:
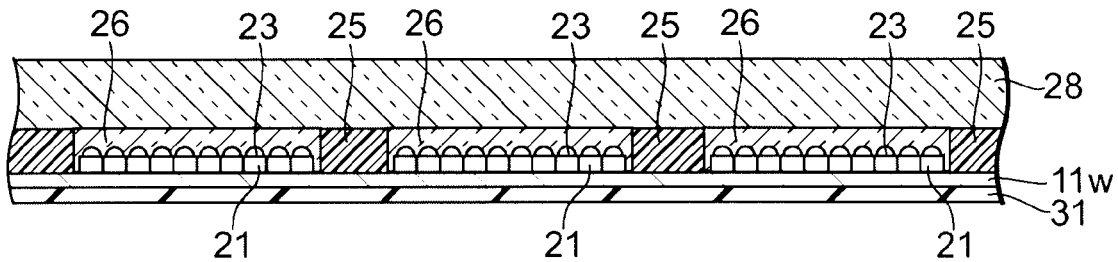
FIGS. 6A and 6B are process cross-sectional views illustrating the method for manufacturing the solid-state imaging device according to this embodiment of the invention.

Then, as illustrated in FIG. 6A, the support substrate 51 is detached from the interconnect layer 31 and removed (referring to FIG. 5C). As a result, the lower face of the interconnect layer 31 is exposed.

Figure 6B:
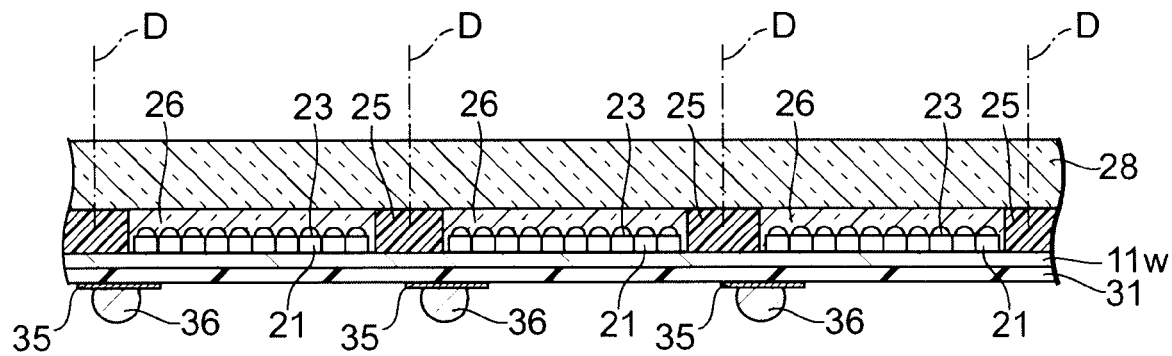

As illustrated in FIG. 6B, the electrode pads 35 are then formed on the lower face of the interconnect layer 31. The solder balls 36 are bonded to the electrode pads 34.

Then, the silicon wafer 11w is diced into a plurality of silicon substrates 11 along a dicing line D set in an interior of the adhesive layer 25 as viewed from above. A plurality of CMOS image sensors 1 such as that illustrated in FIG. 1 to FIG. 3 are thereby manufactured.

Effects of this embodiment will now be described.

In the step illustrated in FIG. 5B for the sensor 1 according to this embodiment, the low refractive index layer 26 is formed in the space surrounded by the adhesive layer 25, and the glass substrate 28 contacts both the upper face of the adhesive layer 25 and the upper face of the low refractive index layer 26. Thereby, in the step illustrated in FIG. 6A, strength and rigidity of the entire sensor 1 can be ensured even when the support substrate 51 is detached from the interconnect layer 31. As a result, the support substrate 51 can be removed from the sensor 1, and the sensor 1 can be thinner by the amount of the support substrate 51. In particular, this effect is prominent in the case where the thickness of the silicon substrate 11 is ten microns or less. Further, the glass substrate 28 contacts the entire upper face of the adhesive layer 25 and the entire upper face of the low refractive index layer 26, and cavities are thereby prevented in the interior of the sensor 1. Thus, the strength and the rigidity of the sensor 1 increase even more.

In the sensor 1 according to this embodiment, the support substrate 51 is not disposed between the interconnect layer 31 and the solder balls 36. Therefore, it is not necessary to make deep vias in the support substrate 51, and manufacturing costs can be reduced.

According to this embodiment, the low refractive index layers 26 increase the rigidity of the silicon wafer 11w and the structural bodies formed thereabove and therebelow. Therefore, damage of the silicon substrates 11 such as chipping, cracks, etc., can be prevented when dicing the silicon wafer 11w into the silicon substrates 11.

Furthermore, the low refractive index layer 26 in this embodiment is formed from a low-refractive-index material having a refractive index lower than that of the material forming the microlens 23. Therefore, refraction occurs at the interface between the low refractive index layer 26 and the microlens 23, and the incident light can be concentrated by the microlens 23. In particular, by using a low-refractive-index material having a refractive index of 1.4 or less, it is possible to obtain a large relative refractive index with the microlens 23, and more effective concentration is possible.

Instead of providing the low refractive index layer 26, it is conceivable to form an adhesive layer made of an adhesive having a low refractive index on the entire surface of the silicon substrate without cavities. However, currently, no practical adherent material is found having a sufficiently low refractive index and sufficiently high light transmission. Currently, therefore, such a method is not realistic.

A comparative example of this embodiment will now be described.

Figure 7:
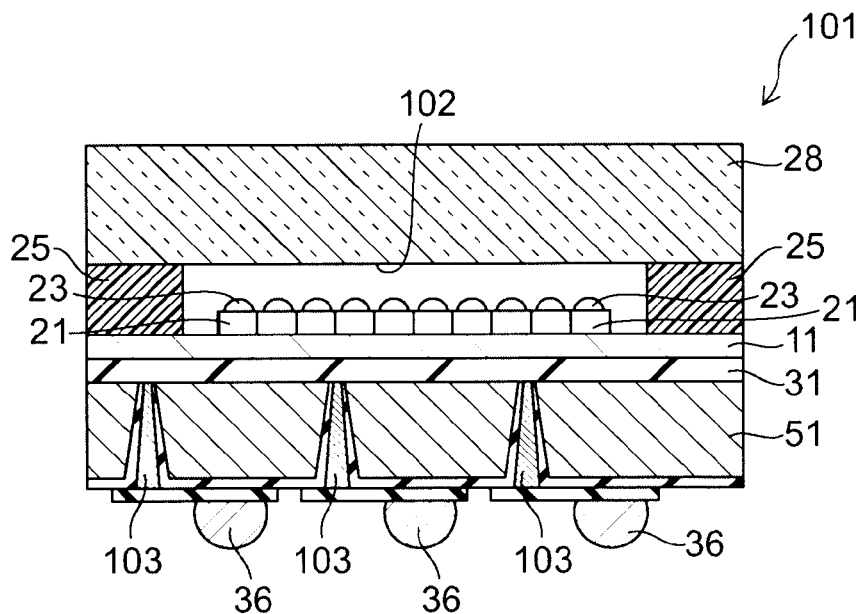
FIG. 7 is a cross-sectional view illustrating a solid-state imaging device according to a comparative example of this embodiment.

FIG. 7 is a cross-sectional view illustrating a solid-state imaging device according to this comparative example.

In this comparative example illustrated in FIG. 7, a backside illuminated CMOS image sensor 101 is manufactured by CSCM (Chip Scale Camera Module) technology similar to that of the embodiment described above. However, the low refractive index layer 26 (referring to FIG. 2) is not provided in the sensor 101. The space surrounded by the adhesive layer 25 is a cavity 102. Therefore, the support substrate 51 is necessary after manufacturing to ensure the strength and rigidity of the sensor 101, and the solder balls 36 are bonded on the lower face of the support substrate 51. Vias 103 are formed in the support substrate 51 to connect the metal interconnect in the interconnect layer 31 to the solder balls 36. Thereby, it is difficult to make the sensor 101 thinner due to the support substrate 51, and making the vias 103 increases manufacturing costs.

Hereinabove, the present invention is described with reference to the embodiment. However, the present invention is not limited to this embodiment. For example, all additions, deletions, or design modifications of components or additions, omissions, or condition modifications of steps appropriately made by one skilled in the art in regard to the embodiment described above are within the scope of the present invention to the extent that the purport of the present invention is included.

For example, in the embodiment described above, an example is illustrated in which the low refractive index layers 26 are formed in the space surrounded by the adhesive layer 25 after forming the adhesive layer 25 in a lattice configuration. However, the order may be reversed. In other words, the low refractive index layers 26 may be formed first by coating a low-refractive-index material on the entire surface of the silicon wafer 11w and making a groove in a lattice configuration in the coating layer made of the low-refractive-index material, after which an adhesive is poured into the groove to form the adhesive layer 25.

Although the embodiment described above illustrates an example in which the solid-state imaging device is a CMOS image sensor, the present invention is not limited thereto. It is sufficient that the solid-state imaging device is a backside illuminated solid-state imaging device, and the solid-state imaging device may be, for example, a CCD image sensor.

Further, although the embodiment described above illustrates an example using a glass substrate as the transparent substrate, the present invention is not limited thereto. It is sufficient that the transparent substrate provides the necessary strength, rigidity, and light transmittance. Furthermore, although the embodiment described above illustrates an example using a solder ball as the external connection member, the present invention is not limited thereto.

The invention claimed is:

1. A solid-state imaging device, comprising:
   a semiconductor substrate including a photodiode formed in an upper face;
   a microlens provided on the semiconductor substrate at a position corresponding to the photodiode;
   an adhesive layer provided on the semiconductor substrate not to cover the microlens, the adhesive layer having a frame-like configuration;
   a low refractive index layer provided on the semiconductor substrate to cover the microlens, the low refractive index layer formed from a low-refractive-index material having a refractive index lower than a refractive index of a material forming the microlens, the low refractive index layer having a rectangular parallelepiped configuration surrounded by the adhesive layer, a height of the low refractive index layer being same as a height of the adhesive layer;
   a transparent substrate covering the adhesive layer and the low refractive index layer, the transparent substrate contacting both an upper face of the adhesive layer and an upper face of the low refractive index layer, and the transparent substrate adhered to the semiconductor substrate by the adhesive layer;
   an interconnect layer provided on a lower face of the semiconductor substrate; and
   an external connection member bonded to a lower face of the interconnect layer.

2. The device according to claim 1, wherein
   a sensor unit and a peripheral circuit unit are set in the semiconductor substrate, the sensor unit receiving light and converting the light into an electrical signal, the peripheral circuit unit driving the sensor unit and processing the electrical signal output by the sensor unit, and
   the adhesive layer is disposed in an outer circumferential side portion of a region directly above the peripheral circuit unit, and the low refractive index layer is disposed in a region directly above the sensor unit and in a region directly above an inner circumferential side portion of the peripheral circuit unit.

3. The device according to claim 1, wherein the low refractive index layer contacts the microlens.

4. The device according to claim 1, wherein the refractive index of the low-refractive-index material is not greater than 1.4.

5. The device according to claim 4, wherein the refractive index of the low-refractive-index material is not greater than 1.3.

6. The device according to claim 1, wherein the refractive index of the material forming the microlens is not less than 1.5.

7. The device according to claim 1, wherein the refractive index of the material forming the microlens is not less than 1.5, and the refractive index of the low-refractive-index material is not greater than 1.4.

8. The device according to claim 1, wherein the transparent substrate is a glass substrate.

9. The device according to claim 1, wherein the external connection member is a solder ball.

10. The device according to claim 1, wherein the device is a CMOS image sensor.

11. A method for manufacturing a solid-state imaging device, comprising:
   forming an interconnect layer on a lower face of a semiconductor substrate;
   adhering a support substrate over a lower face of the interconnect layer;
   performing a thickness reduction of the semiconductor substrate from an upper face side;
   forming a photodiode in an upper face of the semiconductor substrate;
   forming a microlens on the semiconductor substrate at a position corresponding to the photodiode;
   forming an adhesive layer on the semiconductor substrate in a region not covering the microlens and forming a low refractive index layer on the semiconductor substrate in a region covering the microlens, the low refractive index layer made of low-refractive-index material having a refractive index lower than a refractive index of a material forming the microlens, an upper face of the low refractive index layer is formed at substantially the same height as an upper face of the adhesive layer in the forming the adhesive layer and the low refractive index layer;
   adhering a transparent substrate to the semiconductor substrate by the adhesive layer to cover the adhesive layer and the low refractive index layer;
   removing the support substrate; and bonding an external connection member to a lower face of the interconnect layer.

12. The method according to claim 11, wherein a thickness of the semiconductor substrate prior to the thickness reduction is not less than 100 microns, and a thickness of the semiconductor substrate after the thickness reduction is not greater than 10 microns.

13. The method according to claim 11, further comprising:
forming an impurity diffusion region in the lower face of the semiconductor substrate,
the forming the impurity diffusion region and the forming the interconnect layer forming: a drive circuit and a signal processing circuit in a region where a peripheral circuit unit is to be formed, and a transfer transistor and an amplifier transistor in a region where a sensor unit is to be formed.

14. A method for manufacturing a solid-state imaging device, comprising:
forming an interconnect layer on a lower face of a semiconductor substrate;
adhering a support substrate over a lower face of the interconnect layer;
performing a thickness reduction of the semiconductor substrate from an upper face side;
forming a photodiode in an upper face of the semiconductor substrate;
forming a microlens on the semiconductor substrate at a position corresponding to the photodiode;
forming an adhesive layer on the semiconductor substrate in a region not covering the microlens and forming a low refractive index layer on the semiconductor substrate in a region covering the microlens, the low refractive index layer made of low-refractive-index material having a refractive index lower than a refractive index of a material forming the microlens,
adhering a transparent substrate to the semiconductor substrate by the adhesive layer to cover the adhesive layer and the low refractive index layer;
removing the support substrate; and
bonding an external connection member to a lower face of the interconnect layer,
the forming the adhesive layer and the low refractive index layer including:
forming the adhesive layer on the semiconductor substrate, and
forming the low refractive index layer in a space partitioned by the adhesive layer.

15. The method according to claim 14, wherein a thickness of the semiconductor substrate prior to the thickness reduction is not less than 100 microns, and a thickness of the semiconductor substrate after the thickness reduction is not greater than 10 microns.

16. The method according to claim 14, further comprising:
forming an impurity diffusion region in the lower face of the semiconductor substrate,
the forming the impurity diffusion region and the forming the interconnect layer forming: a drive circuit and a signal processing circuit in a region where a peripheral circuit unit is to be formed, and a transfer transistor and an amplifier transistor in a region where a sensor unit is to be formed.

* * * * *